United States Patent [19]
Gruening et al.

[11] Patent Number: 6,093,614
[45] Date of Patent: *Jul. 25, 2000

[54] MEMORY CELL STRUCTURE AND FABRICATION

[75] Inventors: Ulrike Gruening; Jochen Beintner; Hans-Oliver Joachim, all of Wappingers Falls, N.Y.

[73] Assignee: Siemens Aktiengesellschaft, Munich, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 09/034,519

[22] Filed: Mar. 4, 1998

[51] Int. Cl.[7] ..................................................... H01L 21/20
[52] U.S. Cl. ........................ 438/388; 438/387; 438/389; 438/391
[58] Field of Search .................................. 438/386, 387, 438/388, 389, 391

[56] References Cited

U.S. PATENT DOCUMENTS

| | | | |
|---|---|---|---|
| 5,365,097 | 11/1994 | Kenney | 257/302 |
| 5,525,531 | 6/1996 | Bronner et al. | 438/152 |
| 5,844,266 | 12/1998 | Stengl et al. | 257/301 |

Primary Examiner—Donald L. Monin, Jr.
Assistant Examiner—Ginette Peralta
Attorney, Agent, or Firm—Stanton C. Braden

[57] ABSTRACT

A pair of memory cells for use in a DRAM are formed in a monocrystalline bulk portion of a silicon wafer by first forming a pair of vertical trenches spaced apart by a bulk portion of the wafer. After a dielectric layer is formed over the walls of each trench, the trenches are each filled with polycrystalline silicon. By a pair of recess forming and recess filling steps there is formed at the top of each trench a silicon region that was grown epitaxially with the intermediate bulk portion. Each epitaxial region is made to serve as the body of a separate transistor having its drain in the lower polysilicon fill of a trench, and its source in the monocrystalline bulk intermediate between the two epitaxial regions. The lower polysilicon fill of each trench is also made to serve as the storage node of the capacitor of each cell, with the bulk serving as the other plate of the capacitor.

7 Claims, 11 Drawing Sheets

MEMORY CELL STRUCTURE AND FABRICATION

This invention relates to memory cells, and more particularly, to memory cells of the kind that are arranged in large arrays in a silicon chip to form dynamic random access memory (DRAM).

BACKGROUND OF THE INVENTION

DRAMs have become one of the most important of integrated circuit devices. The memory cell of a state of the art DRAM comprises a switch, generally an MOS transistor, and a storage capacitor, generally a trench capacitator. Memory cells of this kind in the millions are formed in a single chip of silicon and arranged in rows and columns. These are addressed by bit lines and word lines of auxiliary circuits that read in and read out binary digits (bits) stored in the capacitors.

The trend is to even higher and higher density of memory cells in a single chip. This requires that the cells be made smaller and smaller to permit higher and higher packing density. Typically, the memory cell of a DRAM uses for storage a capacitor that is formed by a polysilicon-filled trench that is isolated from the monocrystalline bulk of the chip by a dielectric layer that serves as the capacitor dielectric. The switch of the cell is formed by an MOS transistor in the monocrystalline bulk that has one of its current terminals, to be termed the drain, conductively connected to the polysilicon fill of the trench and the other, to be termed the source, connected to the bit line of the DRAM. Moreover, a recent innovation is to form the transistor as a vertical transistor located over the trench to save surface area of the silicon chip and so permit a higher packing density of cells in the chip.

One of the major problems posed by this kind of switching transistor is the need to form its most critical region, the base in which is formed the conductive channel when the transistor is closed, in essentially monocrystalline silicon, if the transistor is to have desired switching characteristics.

The present invention seeks to provide an improved solution to this problem.

SUMMARY OF THE INVENTION

In one aspect the present invention is directed to a method of forming a memory cell adaptable for integration into large arrays to form a DRAM. As is customary, most of the processing is carried out in a large wafer that is subsequently diced up into individual silicon chips, each of which will contain a very large number of memory cells arranged in rows and columns along with the auxiliary circuits that provide the bit and word lines that provide access to the individual cells.

A feature of the novel method is that there is formed in the top portion of a deep trench that is used for the storage capacitor, a layer of silicon that has been grown epitaxially from adjacent monocrystalline silicon that is part of the original monocrystalline bulk of a silicon wafer.

In one form of the invention, a pair of switching transistors, each having its epitaxial silicon body or base in a different trench, share a common drain that is formed in the original bulk between the two trenches.

From the process aspect the present invention is directed to a specific method for forming a memory cell for use in a dynamic random access memory including a transistor in series with a capacitor. The basic steps of this specific method are: preparing a semiconductive wafer whose active bulk where the cell is being formed is monocrystalline; forming a vertical trench at the top surface of the active bulk of the wafer; forming a first dielectric layer over the walls of the trench suitable for use as the dielectric of the capacitor; filling the trench with polysilicon; forming a first recess in the polysilicon fill; forming a collar dielectric layer thicker than the first dielectric layer over the walls of the first recess; refilling the trench with polysilicon; forming a second recess in the trench of a second depth less than the first depth; removing all dielectric from the walls of said second recess for exposing bulk monocrystalline silicon; refilling the second recess by growing silicon epitaxially from the exposed bulk monocrystalline silicon; etching for exposing a portion of the surface of the epitaxially grown silicon; forming over the exposed surface of the epitaxially grown silicon a dielectric layer suitable for use as the gate dielectric of the transistor; forming over the gate dielectric a conductive layer for serving as the gate conductor of the transistor; and forming a conductive layer in contact with the top of the epitaxial fill for serving as the drain of the transistor with a buried portion of the polysilicon fill of the trench serving as the source of the transistor.

In an embodiment, the method of the invention is more particularly as follows. First there is prepared a silicon wafer that is essentially monocrystalline and has at least an active surface portion that is of p-type conductivity. After the customary PAD layer has been formed over the top surface, the layer is patterned to define the various active areas that are to house pairs of individual memory cells. Then a relatively deep vertical trench typically of essentially circular cross section, is formed separately where each capacitor of each pair of memory cells is to be housed. The walls of the trench are now covered with a relatively thin, insulating layer that will serve as the dielectric layer of the capacitor. Each trench is now filled with n-type doped polysilicon. Then a relatively deep first recess is formed in each trench and the relatively thin insulating layer is removed from the recessed portion of each trench and replaced with a thicker insulating collar. The first recess in each trench is now refilled with n-type doped polysilicon. Then a second, relatively shallow, recess is formed in each trench, after which the collar portion exposed in the second recess is removed to bare along the side wall of this second recess monocrystalline silicon that is part of the original bulk. This second recess is now refilled with a silicon region that has been grown epitaxially from the bared monocrystalline silicon bulk. Next, isolation trenches are formed over the wafer to isolate from one another the active areas where pairs of memory cells are to be formed. These isolation trenches essentially bisect the silicon regions that were grown epitaxially. Then these isolation trenches are filled with silicon oxide and the silicon oxide is patterned to expose the surface of the bisected portions of the individual epitaxial regions and provide recesses where gate conductors can be provided for the transistors. However, first a silicon oxide layer is formed over the exposed epitaxial silicon regions to provide the transistor gate dielectric, after which the gate conductors are deposited in the recesses. Finally, there is bared a surface portion of the original bulk intermediate between the top surfaces of the two associated epitaxial silicon regions enclosed within the shallow isolation trenches, and a drain region is formed there that serves a a common drain for the pair of adjacent transistors within each active area. Finally the separate gate conductors of the pair of adjacent transistors are connected to separate word lines and their common drain is connected to a common bit line.

With respect to the product aspect of the invention, there results a memory cell in which the switching transistor has a drain, which it shares with an adjacent transistor of another memory cell, that is largely in the original monocrystalline bulk, a source that is largely buried deep in the vertical trench, and an epitaxial base or body region that provides an essentially vertical channel in the vertical trench, and the storage capacitor has its storage node deep in the vertical trench and its other plate in the original bulk. As a result, little of the top surface of the wafer is used in providing the memory cell and the channel of its transistor is formed in epitaxial silicon fill of the vertical trench that also provides its storage capacitor.

Moreover, by locating a pair of square vertical trenches on opposite sides of a square central bulk portion, each trench being of the minimum feature size, a pair of memory cells can be formed, each of which uses only the surface area that corresponds to four squares of the minimum feature size.

From the product aspect the present invention is directed to an array of memory cells with each memory cell including a transistor in series with a capacitor. The array of memory cells comprises a monocrystalline silicon wafer. The monocrystalline silicon wafer having top surface including a plurality of active areas each separated from one another by a shallow dielectric isolation trench, each active area including a central bulk monocrystalline portion that includes a surface layer of one conductivity type suitable for use as the source of a transistor and an underlying portion of the opposite conductivity; separate first and second epitaxial regions of the opposite conductivity type adjacent opposite sides of the underlying portion of each central bulk portion; separate gate dielectric layers over surface portions of the epitaxial regions spaced from the central bulk portion; polysilicon filled trenches doped to be of the one conductivity type underlying each epitaxially grown regions for providing a source for the transistor and a portion for use as the storage node of a capacitor; and a dielectric layer suitable for use as the dielectric of the capacitor between the polysilicon fill of each trench and the bulk of the wafer.

The invention will be better understood from the following more detailed description taken in conjunction with the accompanying drawings.

Figure 1A:
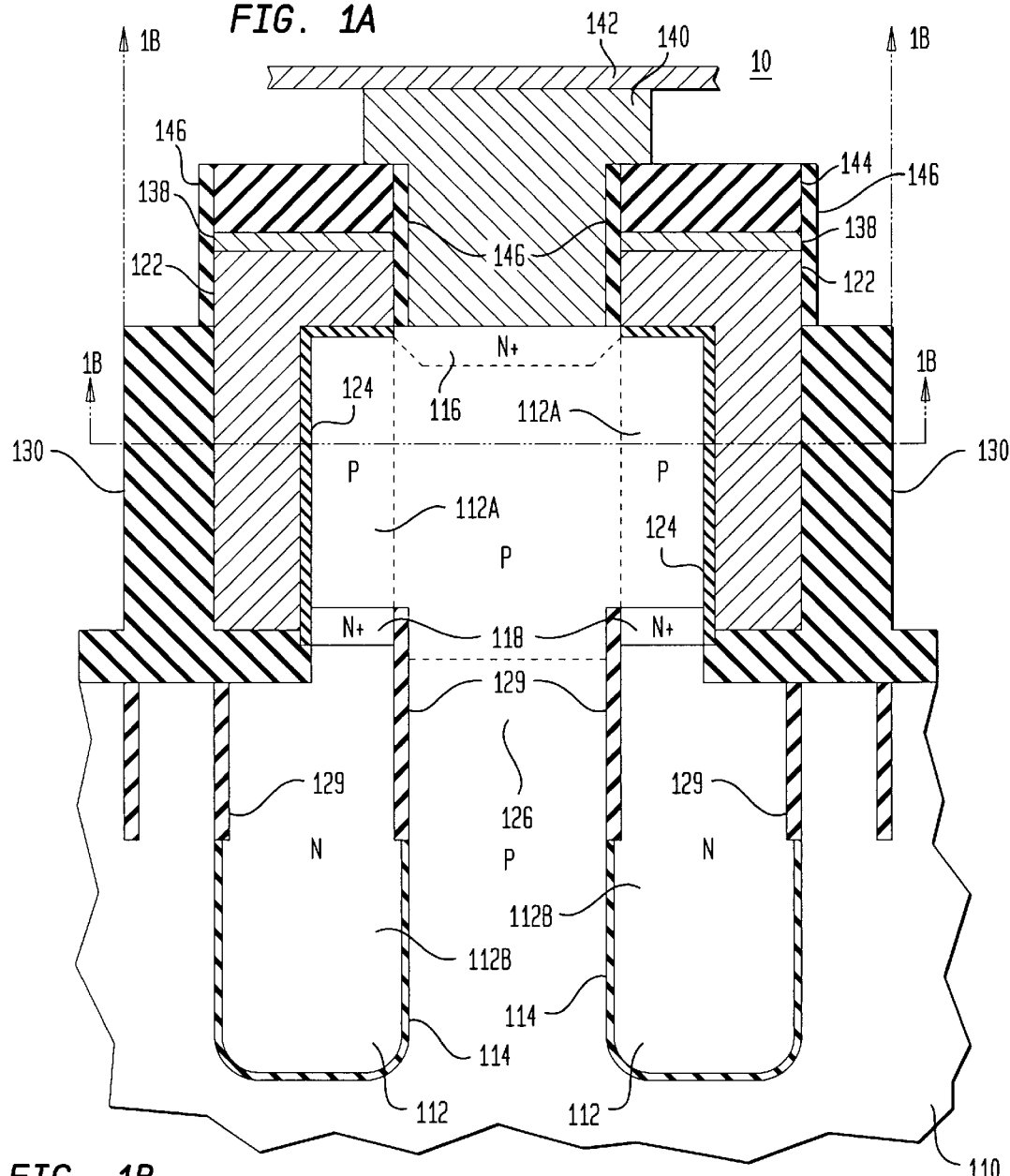
FIG. 1A is a vertical cross section of a portion of a silicon chip housing a pair of memory cells illustrative of the invention.

It is to be noted that the drawing is not always to scale.

DETAILED DESCRIPTION

The invention relates to integrated circuits (ICs). Such ICs include memory ICs such as random access memories (RAMs), dynamic random access memories (DRAMs), synchronous DRAMs(SDRAMs), merged DRAM-logic circuits (embedded DRAMs), or other circuits. The ICs are used in, for example, consumer products such as computer systems, cellular phones, personal digital assistants (PDAs), and other electronic products.

To facilitate understanding of the invention a completed memory cell made in accordance with the method aspect of the invention is provided, after which there will be described the process for making such a memory cell.

To this end, FIG. 1A shows a portion of a silicon chip 10 that includes a pair of memory cells of the kind in accordance with the product aspect of the invention. Each memory cell includes a switch in the form of a n-type MOS transistor and a storage capacitor in the form of a trench largely filled with polysilicon and its surrounding bulk.

The bulk 110 of the chip 10 is, for example, of relatively lightly-doped p-type silicon. Shown included in the chip 10 are a pair of relatively deep vertical trenches 112, each of essentially circular cross section of the minimum feature size.

Each trench includes a relatively shallow upper portion 112A and a relatively deep lower portion 112B. The upper portion 112A is essentially monocrystalline and provides the p-type body of the n-channel MOS transistor of the DRAM. Essentially half of the original cross section of this portion of the trench is now occupied by a gate conductor 122 which partially wraps around the epitaxial portion of the trench. The lower polysilicon portion 112B of each trench is typically essentially circular in cross section. Other shapes are also useful. The lower portion 112B provides the inner plate that serves as a storage node of the capacitor of the DRAM. The walls of the lower portion 112B of the trench are covered by a thin insulating layer 114, typically a dual layer that comprises a layer of silicon oxide overlying a layer of silicon nitride, and often described as an oxynitride or ON layer. This insulating layer serves as the capacitor dielectric. The portion of the silicon bulk closely surrounding the outsides of the polysilicon portion of the trench, may comprise a heavily doped n-type skin (not shown) that serves as the other plate of the capacitor. This skin typically is formed by the out diffusion of donors from the inside of the trench, before the ON layer is formed.

At the top of each trench 112, there is located a transistor of which a first input/output terminal 116, usually described as the drain, is largely located in the n-type monocrystalline silicon bulk portion of the wafer intermediate between the pair of trenches 112, while a second input/output terminal 118, usually described as the source, is located in the lower portion 112B of the trench 112. The upper p-type portion 112A of each trench provides the body in which there is induced a channel of its transistor. The two transistors share the common drain 116 in the intermediate bulk portion.

As will be more fully described later, each trench 112 is filled in a manner to form at its top portion 112A a region that is essentially monocrystalline so it can serve satisfactorily as the body of the transistor. A thin gate oxide layer 124 separates the polysilicon gate conductor 122 from the monocrystalline base region 112A. The channel (not shown), is formed along the edge of the monocrystalline region 112A adjacent the gate dielectric layer 124 and is induced by an appropriate voltage on the gate conductor 122. The gate conductor 122 typically comprises a region of heavily doped n-type polysilicon.

A p-type region 126, moderately doped p-type, of the original bulk separates the body regions upper portions 112B of trenches 112 of the pair of transistors. A dielectric collar 129 surrounds an intermediate portion of each trench 112 and serves to isolate the transistors from one another.

The regions 130 that surround the gate conductors 122 are silicon oxide-filled shallow isolation trenches and serve to isolate the gate conductors 122. A highly conductive layer 138, typically of a metal silicide, such as tungsten silicide, overlies each gate conductor 122 and serves as the word line. A conductive layer 140, typically of highly doped polysilicon, overlies the common source 116 of adjacent pairs of transistors and connects to a conductive bit line 142. The bit lines 142 generally run orthogonal to the word lines 138 over the top surface of the chip.

Insulating layers 144 and 146, typically of silicon nitride, serve to insulate the bit lines 142 and the word lines 138 from one another.

Figure 1B:
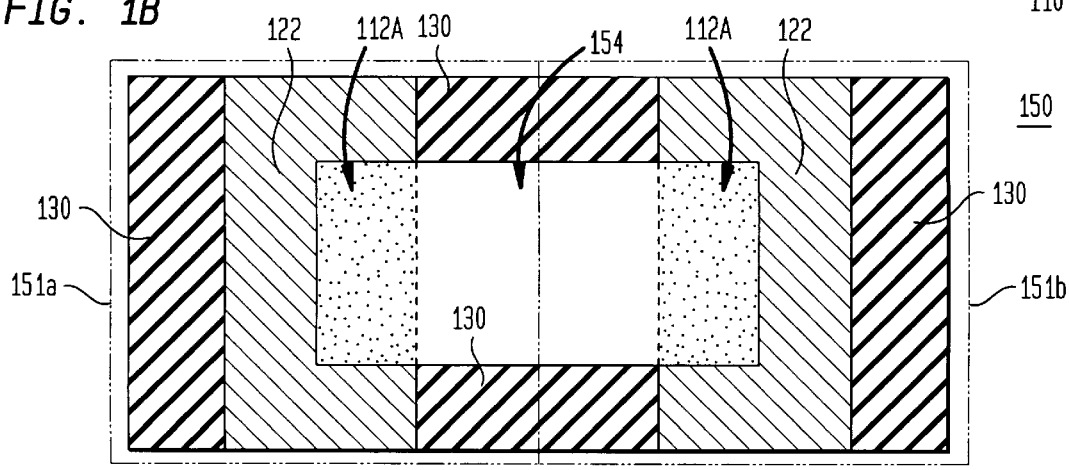
FIG. 1B is a section taken along dashed lines 1B—1B of FIG. 1A.

In FIG. 1B there is shown the portion 150 of the silicon chip shown in FIG. 1A taken through the dashed line 1B—1B of FIG. 1A. It comprises a pair of memory cells that share a central portion 154 that is part of the original bulk silicon crystal. As shown, the cells are configured in an open bit line architecture. Other bit line architectures, such as folded or open-folded, are also useful. On opposite sides of the central portion 154 are the epitaxial silicon portions 112A that were formed in the trenches. Also occupying a region of what was originally part of a trench are the two gate conductor portions 122 that partially wrap around the epitaxial silicon portions 122A. Portions of the oxide filled shallow isolation trenches 130 help to isolate the two unit cells from one another. FIG. 1B shows a first unit cell within dashed line rectangle 151*a* and a second adjacent unit cell 151*b* within a dashed line rectangle 151*b*. Each of unit cells 151*a* and 151*b* is 2F on each side where F is the minimum feature size. In the interest of simplicity the gate oxide layer 124 has been omitted in the figure.

The process of making memory cell of the kind shown in FIG. 1A, will be described with reference to the remaining figures of the drawing.

In these figures, there usually will be shown only so much of the chip as is needed to understand the particular procedure then being described.

The process involves three main stages. In the first stage, there is first provided an appropriate wafer in which relatively deep vertical trenches are formed. These trenches are made to include deep portions filled with polysilicon to be used for the storage capacitors and shallow portions filled with monocrystalline silicon for use for the transistors. In the second stage, shallow isolation trenches filled with silicon oxide are provided and the oxide fill is then patterned for exposing shallow portions of the epitaxially grown fill, where gate conductors can be provided. In the third stage, the process involves the various steps for forming the transistors in the shallow monocrystalline portions of the trenches and for providing the terminal connections to the transistors and the bit and word lines that connect individual cells into arrays.

Figure 2:
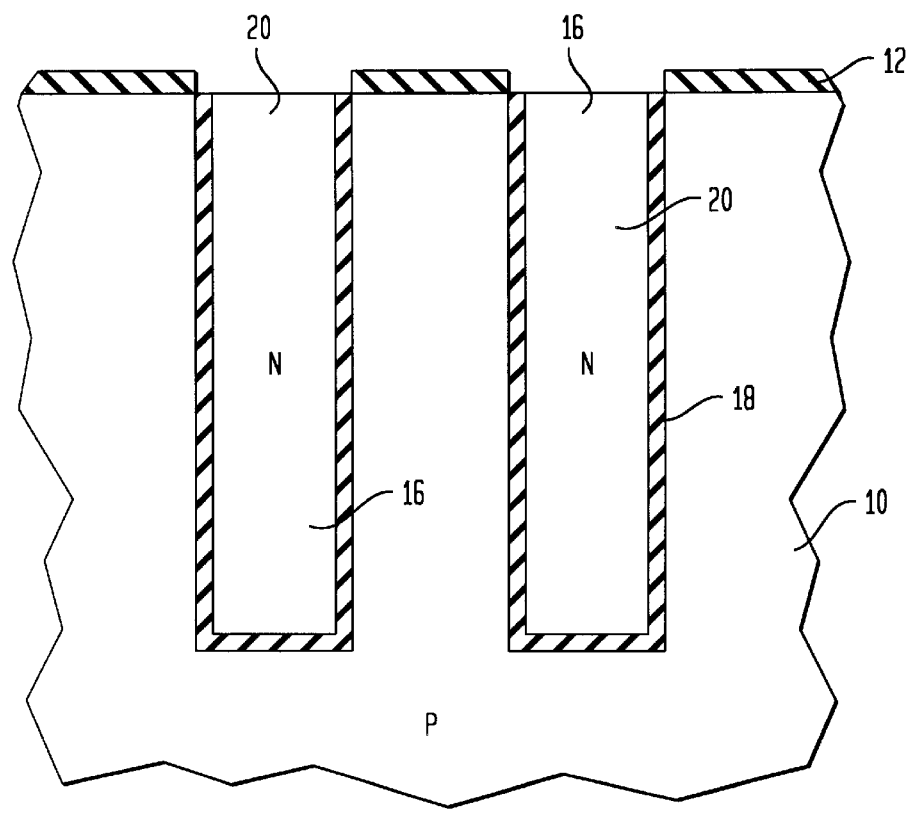
FIGS. 2–13 are cross sections of the silicon chip at various stages of the method for forming therein the pair of memory cells shown in FIG. 1. In these figures, only the top portion of the silicon chip where changes are occurring is shown.

FIG. 2 shows a portion of a silicon wafer 10 in which trenches 16 have been provided. The trenches, for example, have essentially a circular cross-section. Other shapes are also useful. The wafer 10 ultimately will be diced into silicon chips like that of which a portion is shown in FIG. 1. Typically the wafer is of monocrystalline silicon that is relatively lightly doped p-type conductivity. Alternatively, the wafer might comprise an insulating substrate, as of sapphire, on which there has been grown epitaxially a monocrystalline silicon layer. The silicon wafer 10 is initially provided over its top surface with a dielectric layer 12, generally termed the PAD layer, that will serve various supporting roles during the earlier parts of the processing. This PAD layer 12 typically is a dual layer and includes an underlying layer of silicon oxide and an overlying layer of silicon nitride. The nitride layer serves as an etch or polish stop for subsequent processes. A hard mask layer may also be provided to serve as an etch mask for forming the trenches. For the sake of simplicity, the dual layer 12 is shown as a single layer in the drawing. The PAD layer generally is first patterned to define active areas of the top surface where pairs of memory cells are to be formed.

To form the relatively deep trenches 16 that are needed to form the memory cells, there is first provided by known lithographic techniques, on the top surface of the wafer over the PAD layer 12 a suitable mask that is no longer seen in the figure. Then by etching, typically anisotropic reactive ion etching (RIE), there are formed the relatively deep, (e.g., 3 to 20 microns and typically 8 microns) trenches 16, typically of essentially circular cross section, in the top volume of the wafer. After formation of the trenches, the hard mask layer is typically removed.

Often the walls of these trenches 16 are then treated by the diffusion of donors to form thereover a layer of relatively high doping, n+ type, in the example being described, that will serve as the outside plate of the trench capacitor. The polysilicon fill layer later to be included in the trench will serve as the inside plate and the storage node. It is possible to omit this n+type layer in which case the p-type bulk of the wafer will serve as the outside plate. Since this n+ type layer is optional it has not been shown in the drawing. However, before the trench is filled, the capacitor dielectric 18 is formed over the walls of the trench. Typically, the dielectric layer 18 comprises an oxide-nitride-oxide layer, generally described as an ON layer.

After the dielectric layer 18 has been formed, each trench is filled with doped polysilicon, n+-type in the example being described. A trench typically is filled by first depositing a layer of polysilicon over the top surface of the wafer that is thick enough to insure filling of the trench and then planarizing the resultant, typically by chemical mechanical polishing (CMP). The PAD layer 112 typically is used as an etch stop in this CMP process.

The resultant is shown in FIG. 2. Over the top surface of the silicon wafer 10 is the patterned PAD layer 12 which defines the location of the deep trenches 16 whose walls are lined with the dielectric layer 18 and which are filled with doped polysilicon fill 20.

Next, the top surface of the wafer is exposed to localized etching, typically chemical downstream etching (CDE), to form a first recess selectively in the upper portion of each trench 16. The depth of the recess is equal to about the bottom of a dielectric collar that is to be formed in the trenches. Typically, the depth of the recess is about 1–1.5 $\mu$m below the surface of the substrate. The CDE removes the poly in the trench.

Figure 3:
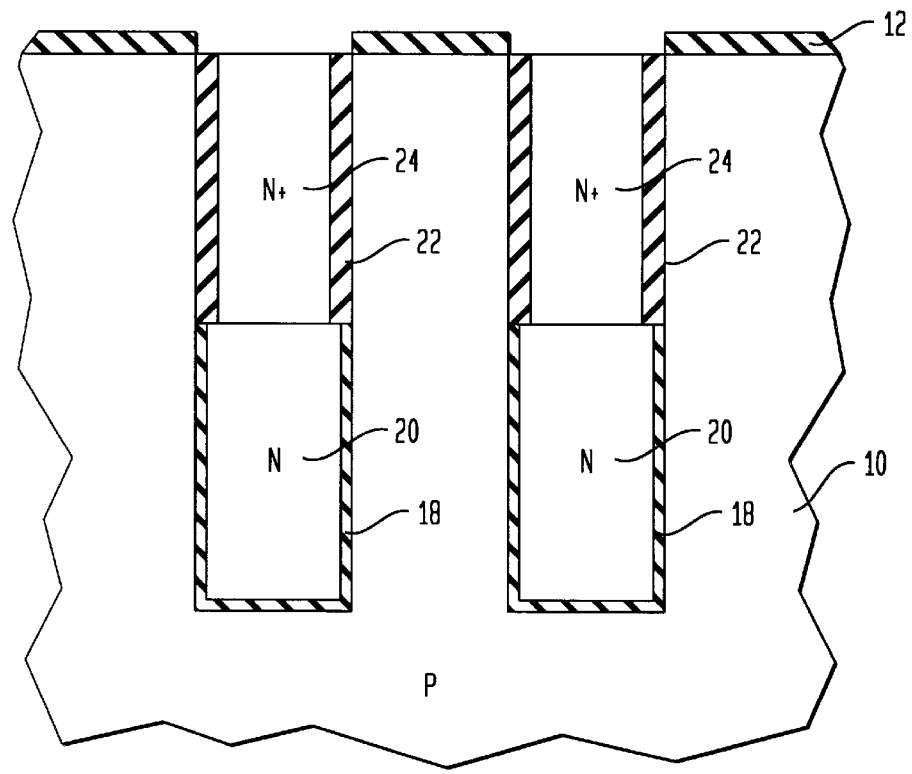

The exposed dielectric layer 18 in the upper portion of the trench is then etched, removing it therefrom. A relatively thicker silicon oxide collar layer 22 is then formed in the upper portion of the trench sidewalls. This includes, for example, depositing an oxide layer over the wafer and etching to remove it from the surface of the pad layer and upper portion of the polysilicon 20, creating the collar 22. After this, the recesses are refilled with a doped layer 24, also n+ type in our example. The n+ type doped layer, for example, comprises polysilicon. The result is seen in FIG. 3.

Figure 4:
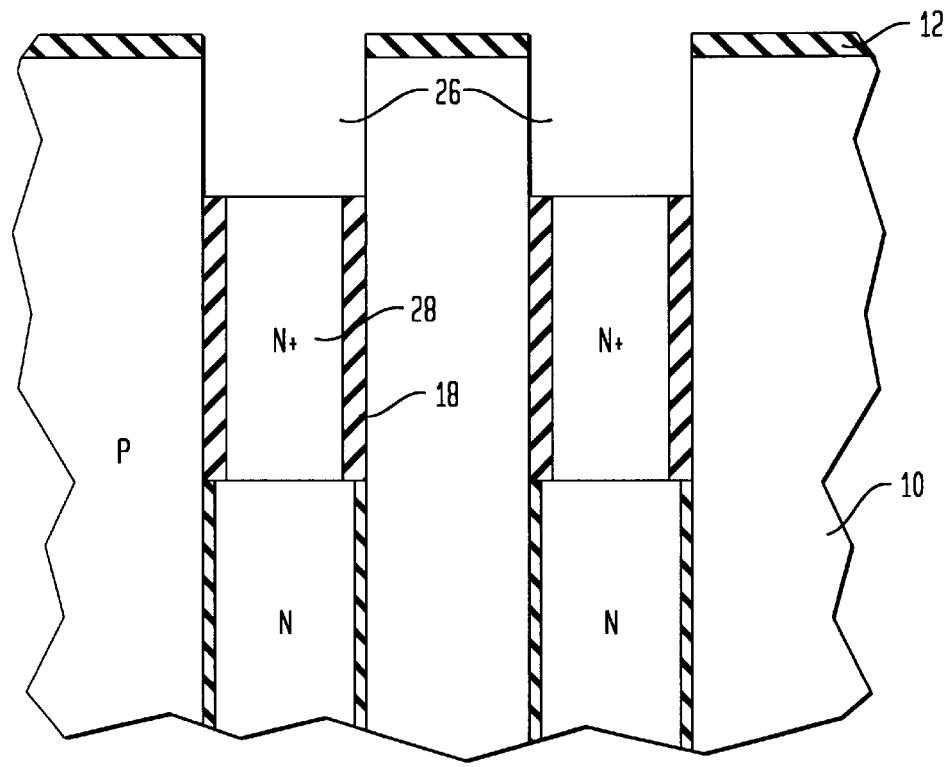

Next a second relatively shallow recess 26 is performed to remove a portion of the n+ doped layer. The recess defines the length of a vertical transistor and buried strap. Typically, the depth of the shallow recess is, for example, about 250 nm below the surface of the substrate. The recess is typically achieved by CDE or RIE in each trench 16. After the doped layer is recessed, the exposed portions of collar 22 are removed. optimally this is followed by a further etching to remove a slight amount of additional doped layer. For example, an additional 50 nanometers of the doped layer is removed. This is followed by a treatment to thoroughly clean the exposed silicon along the walls of the recess, which is monocrystalline since it is part of the original monocrystalline bulk of the wafer. This cleaning advantageously comprises a wet HF cleaning followed by a hydrogen gas prebaking step at about 950° C. The resultant is shown in FIG. 4.

Figure 5:
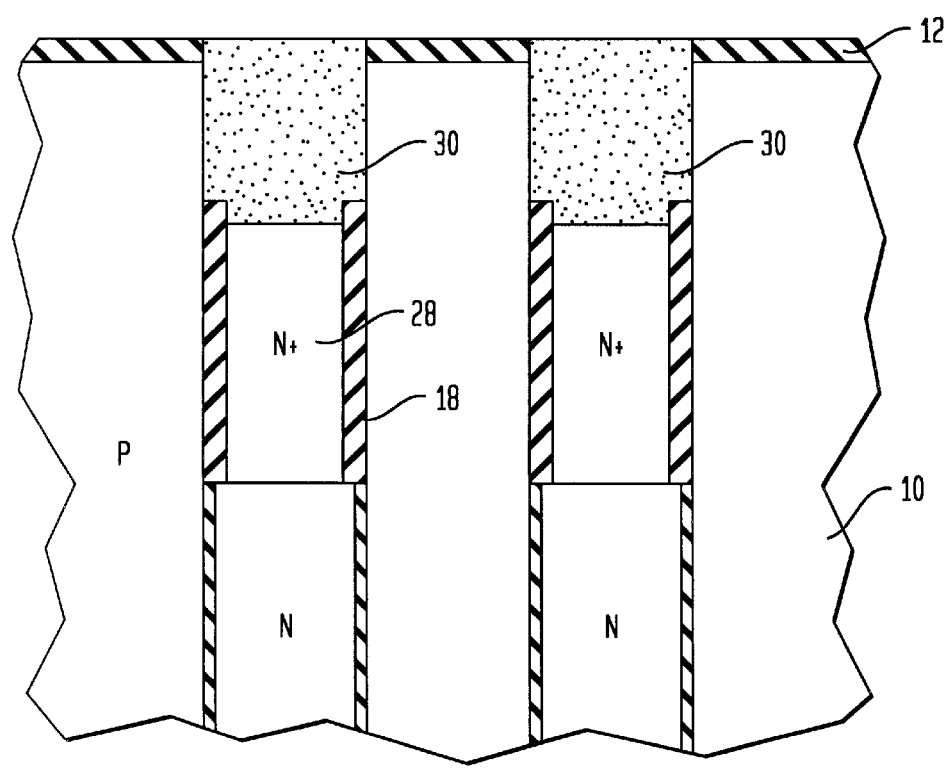

Then, as is seen in FIG. 5, this recess 26 is refilled with a silicon layer 30. This layer 30 will provide the body of the transistor corresponding to region 112A in FIG. 1 and so should be of p-type conductivity in the embodiment depicted. The silicon layer, in accordance with one embodiment of the invention, is advantageously formed by epitaxial techniques. Alternatively, layer 30 initially comprises amorphous silicon in which case the filling is followed by annealing of the kind known to encourage the recrystallization of the deposited silicon into monocrystalline form. As is known, annealing can be used to recrystallize amorphous silicon if it includes a sufficiently large monocrystalline seed around which it can recrystallize. As a result, the top portion 30 of the silicon fill where the collar 22 has been removed in the trench will be essentially monocrystalline whose crystal orientation essentially will match the crystal orientation of the bulk portion of the wafer. The silicon layer 30 is planarized, forming a planar top surface with the pad layer 12.

Figure 6:
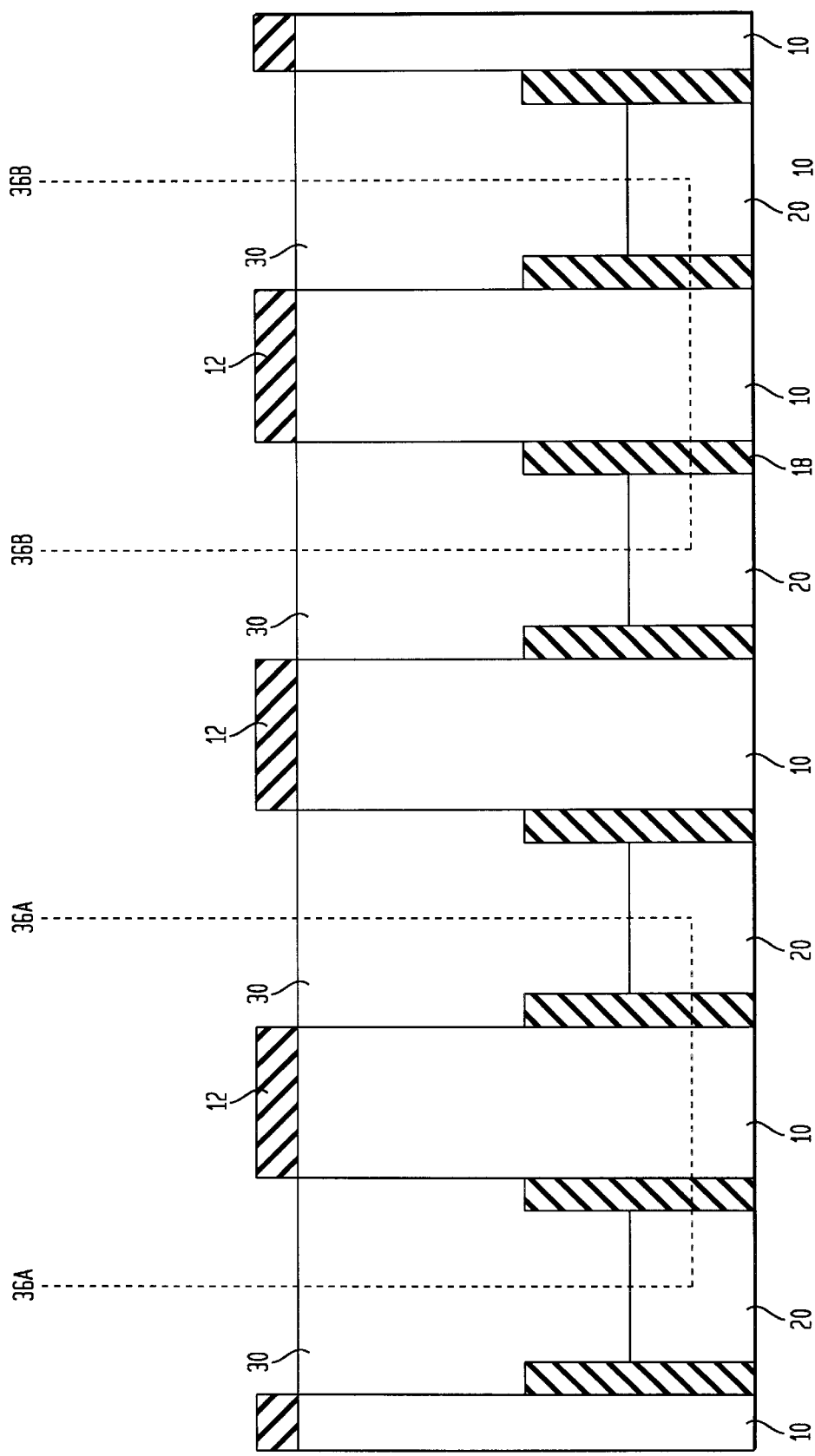
Figure 7:
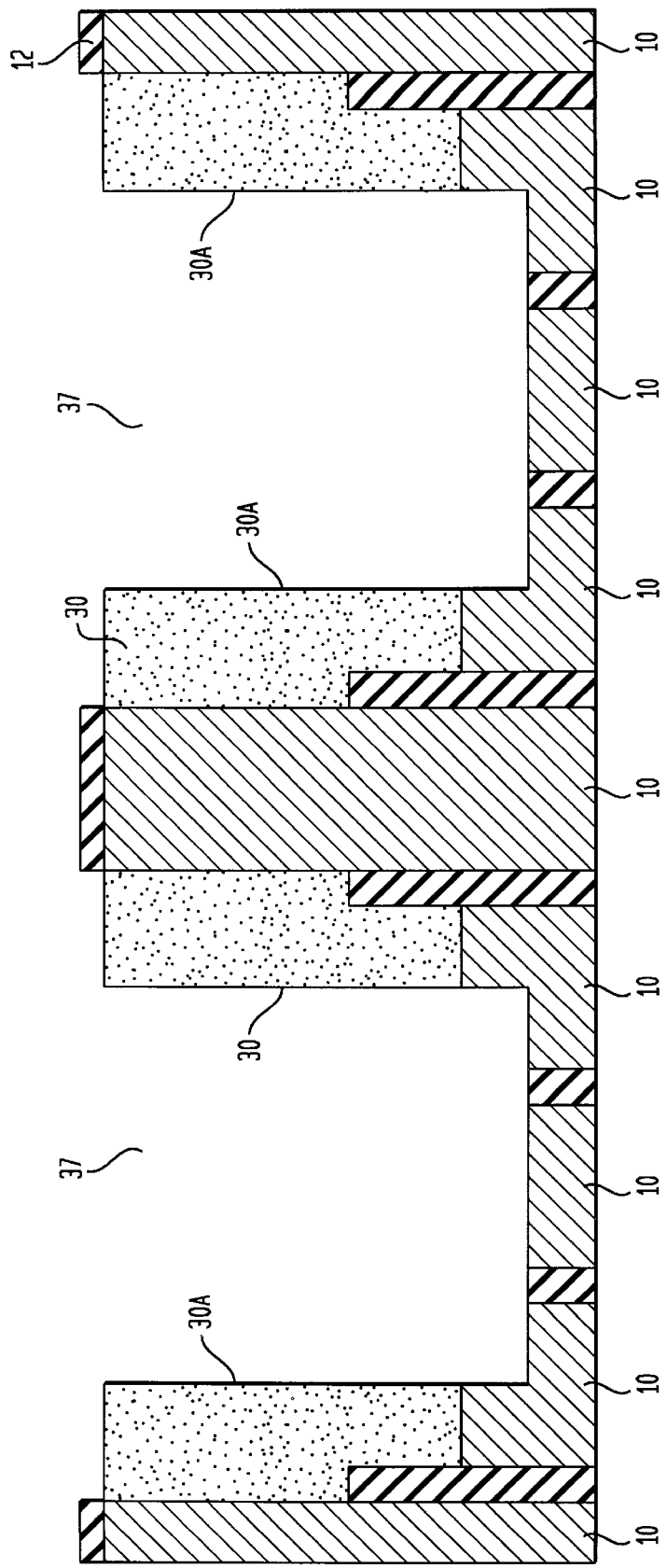

Next the top portion of the silicon wafer 10 is etched to remove the portions shown between dashed lines 36A and 36B seen in FIG. 6. These lines run down the approximate center for bisecting the epitaxial regions. The etching is deep enough to isolate the buried strap from adjacent cells. Typically, the depth of the etch extends into the polysilicon fill 20 of the deep trenches, as is seen in FIG. 7. In one embodiment, the depth of the etch is about 350 nm below the surface of the substrate. The etch forms shallow trenches 37, leaving exposed surface portions 30A of epitaxial silicon. To better distinguish the various regions of the wafer, in this and subsequent figures, the epitaxial regions 30 are shown stippled, and the bulk monocrystalline regions 10 hatched.

These relatively shallow trenches 37 serve to isolate the switching transistors and will serve to isolate pairs of switching transistors from adjacent pairs.

Figure 8:
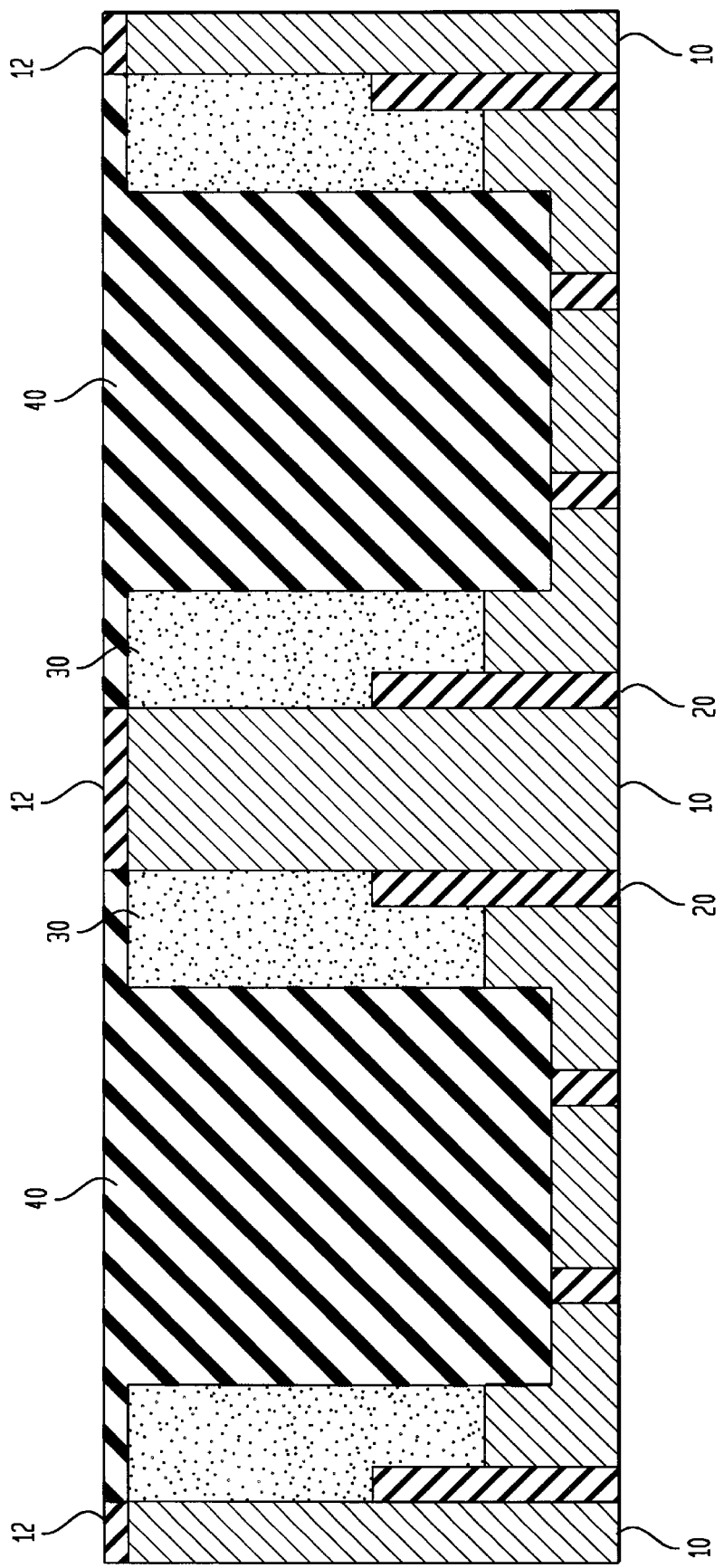

Next, the trenches 37 are filled with silicon oxide 40 as is seen in FIG. 8, typically by first overfilling and then planarizing by CMP.

Figure 9:
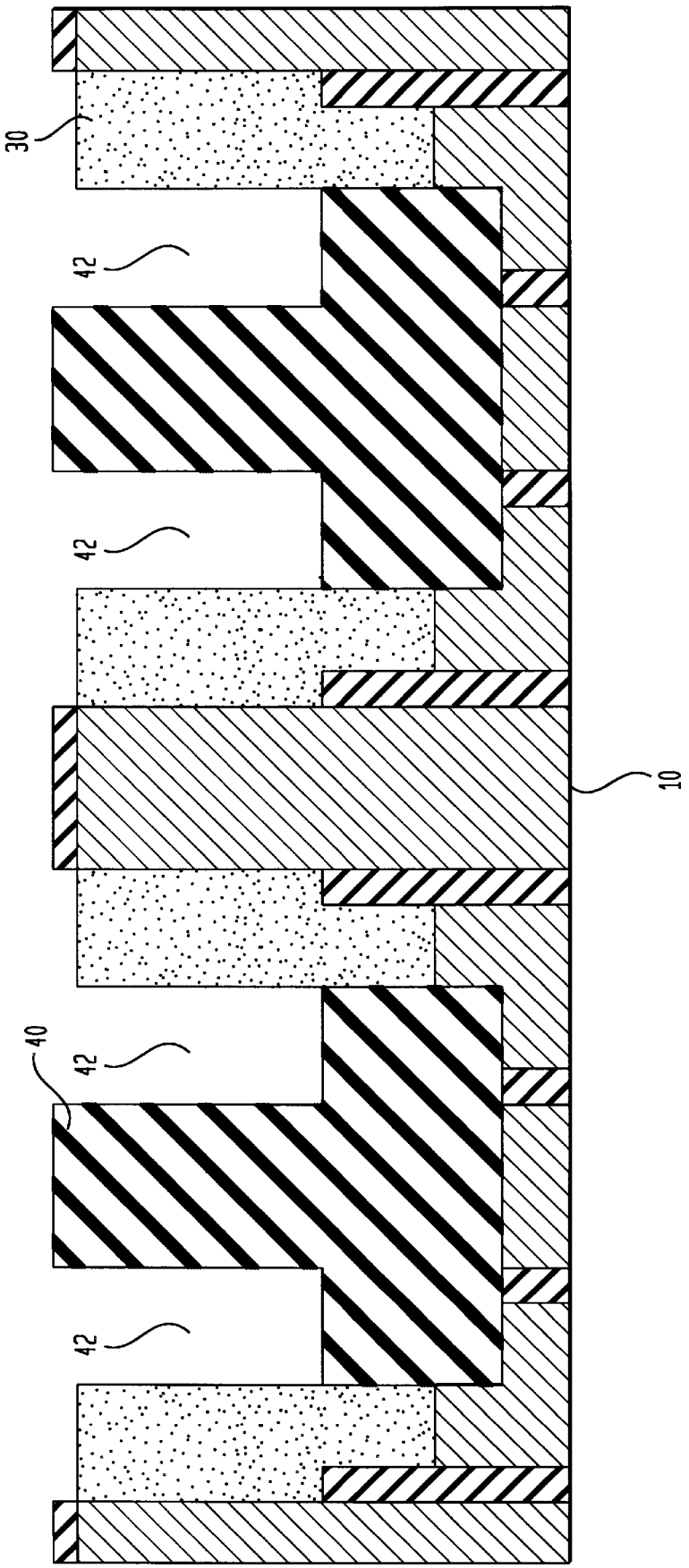

Next, there is need to pattern the silicon oxide fill 40 in these trenches, as is shown in FIG. 9 to define the recesses 42 that are to be filled by the gate conductor, after the gate dielectric is provided. The patterning, typically to about 250 nanometers below the top of the bulk silicon. At this point, there is removed the PAD layer and any oxide residuals remaining on exposed silicon surfaces.

After such cleaning, if it were desired to implant boron ions to adjust the conductivity of the epitaxial silicon to achieve more precisely a desired threshold value, such implant would now be done. Before any such implant, it is customary to form a thin sacrificial oxide over the silicon surfaces being implanted to minimize the surface damage being done by the implantation.

If the original doping of the bulk silicon is chosen appropriately, it may be unnecessary to dope the silicon at this stage.

Figure 10:
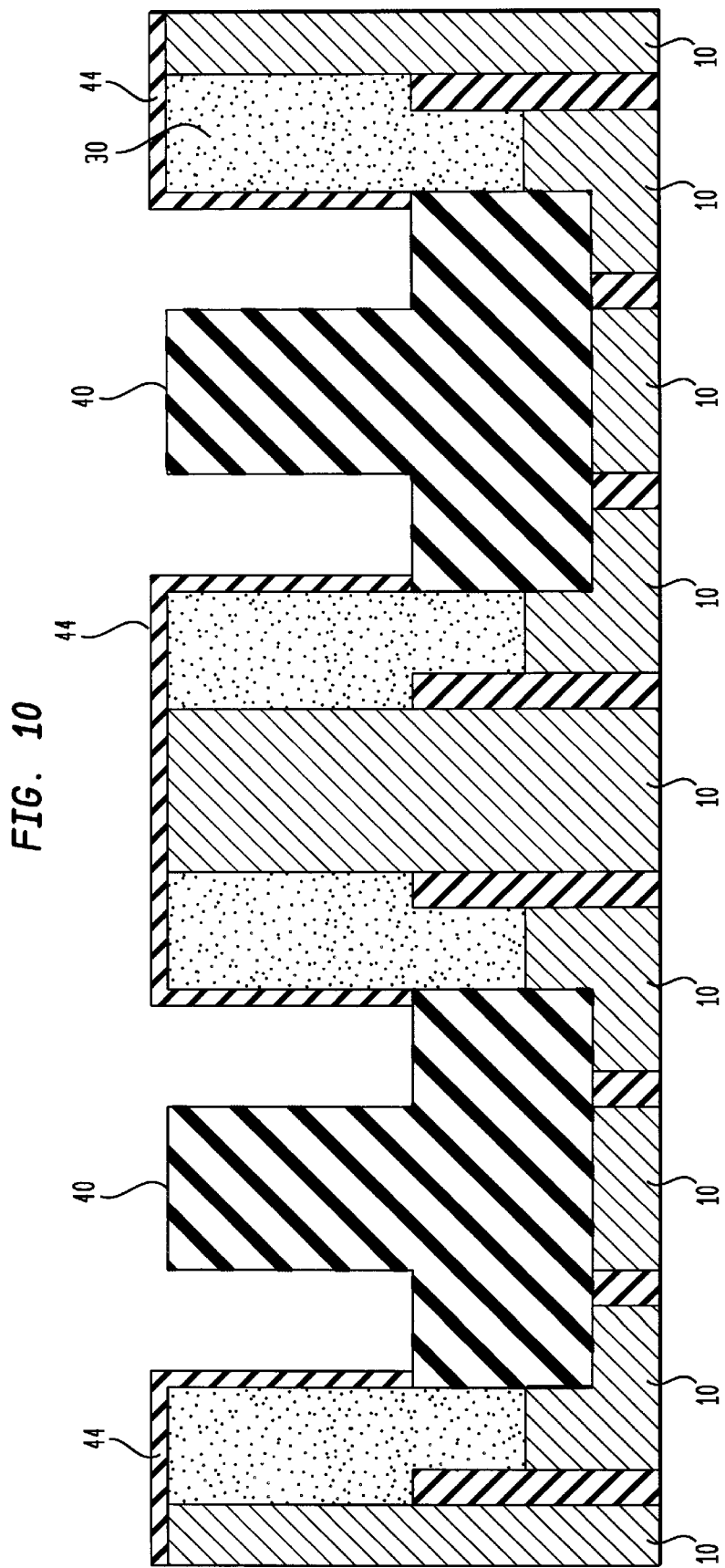

After such implantation, the sacrificial oxide is removed and replaced with a thin oxide 44 of between 60 and 80 Angstroms thick thermally grown over the exposed silicon to serve as the gate dielectric, as is seen in FIG. 10 attached.

Figure 11:
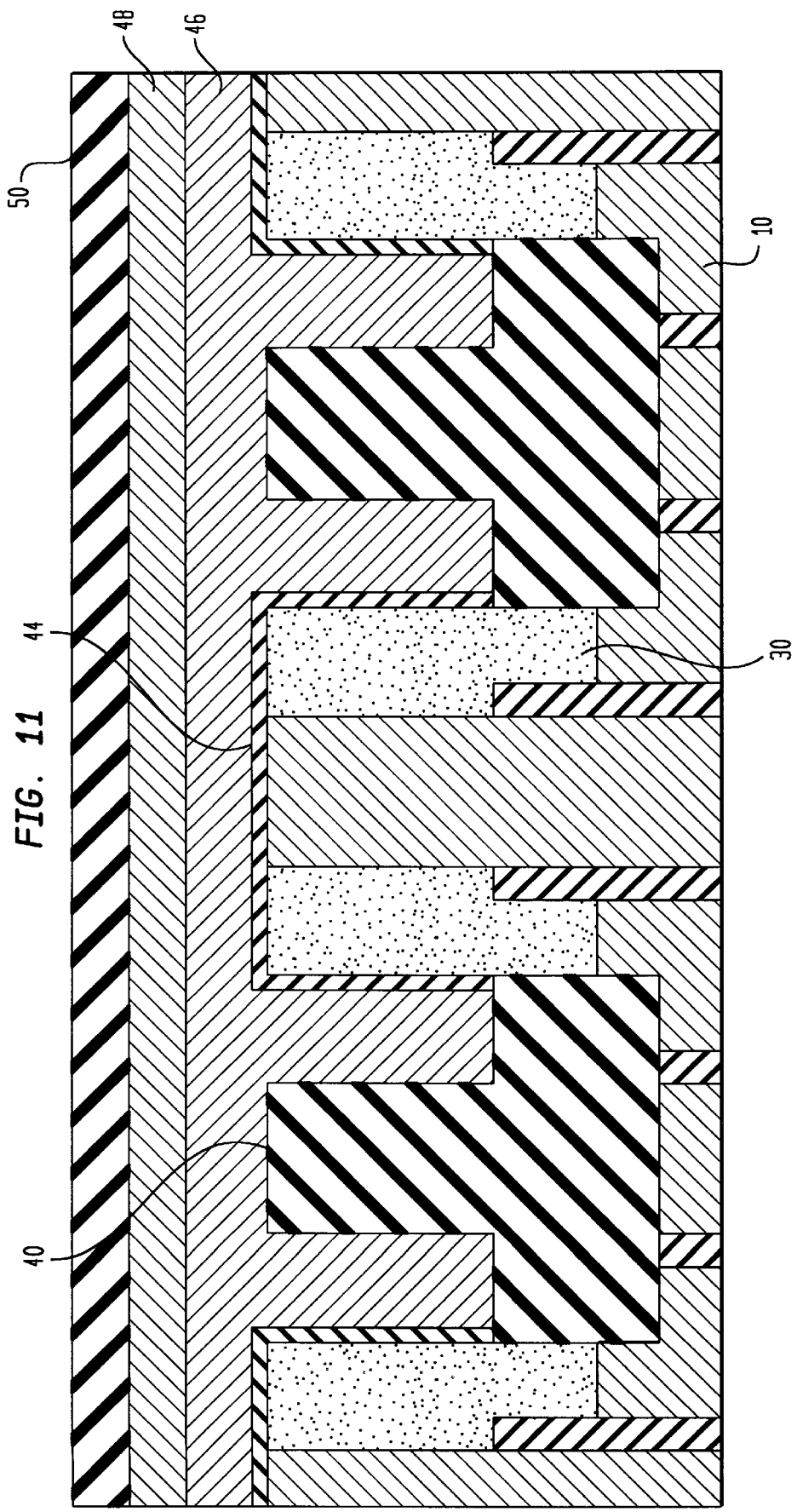

As is seen in FIG. 11, there is next deposited over the surface of the wafer to fill the recesses formed by patterning the silicon oxide a layer 46 of polysilicon suitably doped for serving as the gate conductor of the transistor.

The polysilicon 46 is covered with a highly conductive layer 48, typically a metal silicide such as of tungsten silicide, that will serve as the word line conductor. The tungsten silicide lowers the sheet resistance of the word line conductor. The conductive layer 48 is covered in turn with a suitable capping layer 50, typically of silicon nitride, to protect and insulate it.

Figure 12:
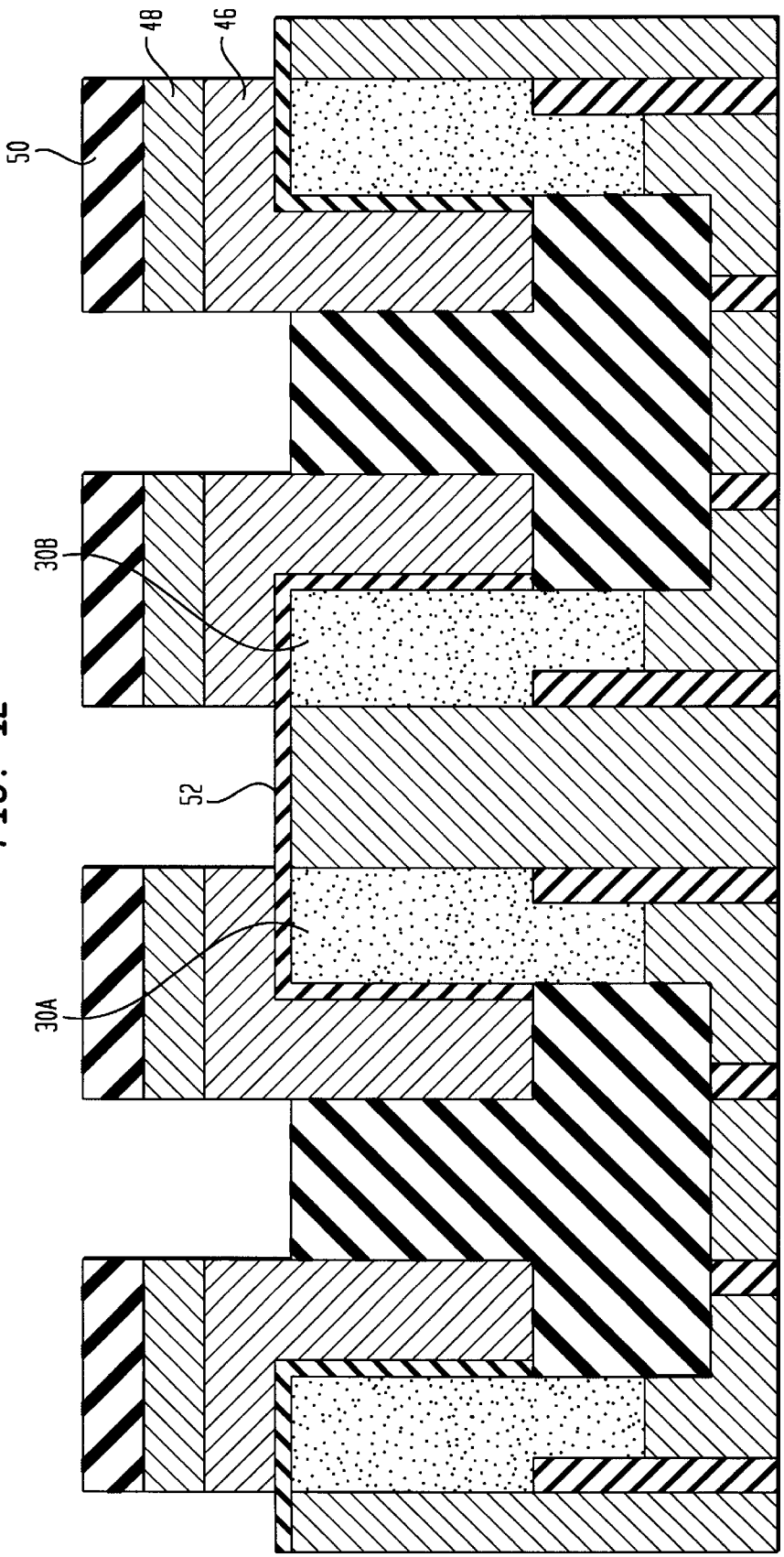

There now remains to pattern the various surface layers to permit other terminal connections to the chip. As is seen in FIG. 12, by this step, there is essentially exposed the oxide covered portion 52 of the original silicon bulk that lies between the pair 30A, 30B of epitaxial regions 30 of the deep trenches. There is also interrupted the doped polysilicon layer 46 and its silicide overlayer 48 to separate pairs of transistors.

Figure 13:
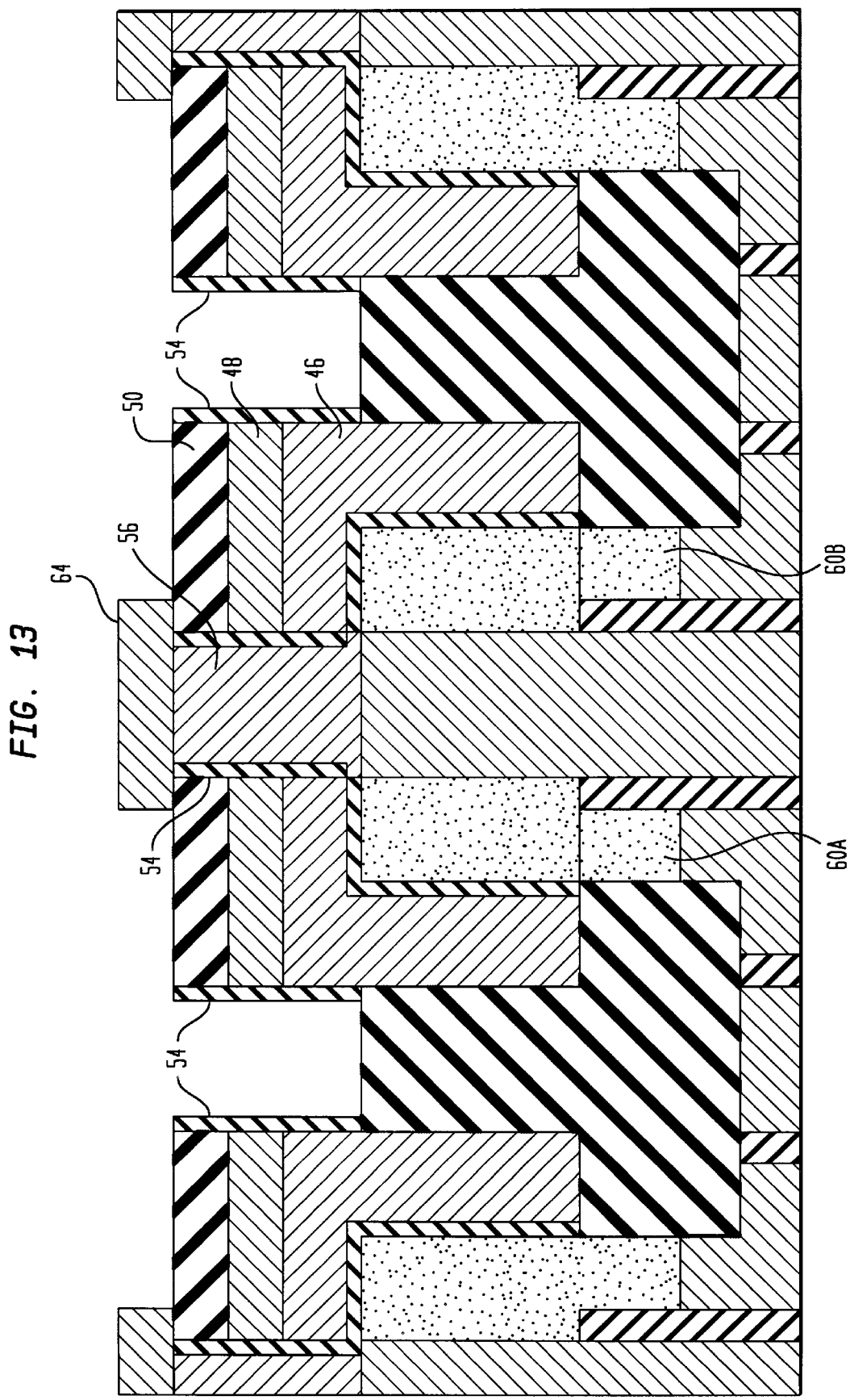

Then, as is shown in FIG. 13, after a suitable layer 54, as of silicon nitride, is provided over the sidewalls of the opening over portion 52 in the silicon bulk, the opening is filled with n-doped polysilicon 56 that contacts the portion 52 of the silicon bulk. Typically, this is done by first depositing an oxide masking layer, which is then patterned photolithographically to define the contact holes. Then the contact holes are etched by reactive ion etching down to the surface of the silicon 52 and the contact holes are filled with the contact polysilicon 56 after which the surface is planarized by CMP as in earlier steps.

The oxide layer over portions 52 is etched away before the deposition of the polysilicon layer 56, typically when contact holes are etched in the oxide. Alternatively, it can be etched away before the deposit of polysilicon layer 56. The wafer is then heated to diffuse donors out of the n-doped polysilicon 56 into the surface portion 52 of the bulk to form an n-type surface layer that effectively serves as the common drain of the pair of transistors, seen as region 116 in FIG. 1. Simultaneously, to the extent they are not already, donors are diffused out of the n-doped polysilicon adjacent the deepest portion of the epitaxial region to form n-doped layer 60A, 60B there that effectively serves as the drain of the switching transistor, seen as region 118 in FIG. 1.

A conductive layer 64, typically of a metal silicide, such as tungsten silicide, is deposited over the doped polysilicon region 56 to serve as the bit line for the two transistors that share the common drain 116.

There accordingly now results an arrangement of the kind shown in FIG. 1A, in which a pair of memory cells are formed in a portion of a silicon chip.

The various procedures in the process that has been described are all believed to be known to workers in the art. Generally, the various etching procedures described are best performed by reactive ion etching, that can be carried out either to be isotropic or anisotropic, as desired, by appropriate choice of the ion or combination of ions used in the plasma provided to do the etching. Moreover, generally the various patterning steps will involve lithography techniques using patterned resists. The choice of the source of the radiation used for sensitizing the resist is chosen to be appropriate to the feature size desired for the patterning. Additionally, the filling of recesses in a pattern to provide the substantially planar surfaces desired for further processing, generally involve deposition of the material that is to fill the pattern to a level to overfill the pattern. Then chemical mechanical polishing (CMP) of the deposited material is performed until the desired planar surface results. Typically in such CMP, a layer, such as the PAD layer or its equivalent, can be used as an etch stop.

It is to be understood that the specific process described is merely illustrative of the basic precepts of the invention and various modifications may be devised by a worker skilled in the art without departing from the spirit and scope of the invention.

What is claimed is:

1. A method of forming a plurality of memory cells for DRAMS in a silicon wafer, each memory cell including a transistor in series with a capacitor, the method comprising the steps of:

preparing a wafer that has at least a top surface portion that is monocrystalline silicon of one conductivity type;

forming in the wafer vertical trenches in the top surface portion;

forming a first dielectric layer over the walls of each of said vertical trenches for use as the dielectric of the capacitor of the cell;

filling each of the vertical trenches with polysilicon of a conductivity type opposite the one conductivity type;

forming a first recess in each of said vertical trenches;

forming a dielectric layer over the side walls of said recesses;

filling each of the first recesses with polysilicon of the opposite conductivity type;

forming a second recess shallower than the first recess in each of the vertical trenches;

cleaning the walls of each of said second recesses of dielectric for exposing monocrystalline silicon;

refilling each of the second recesses with monocrystalline silicon that is of the one conductivity type for serving as the body of the transistor of the cell and that is epitaxially grown from the exposed monocrystalline silicon;

forming in the wafer shallow trenches for surrounding pairs of vertical trenches to a depth below that of the second recesses and for exposing a portion of the epitaxially grown silicon of each of the vertical trenches;

filling the shallow trenches with silicon oxide;

etching new recesses in the silicon oxide-filled shallow trenches for reexposing portions of the epitaxially grown silicon;

forming a layer for serving as the transistor gate dielectric over the exposed portions of the epitaxially grown silicon;

filling the recesses in the silicon oxide-filled trenches for covering the gate dielectric with conductive material for use as the gate conductor; and forming a separate conductive region of the opposite conductivity type as the transistor drain in the monocrystalline portion of the wafer that lies between each pair of vertical trenches in which a cell hag been formed.

2. A process of forming memory cells including a switching transistor in series with a storage capacitor comprising the steps of:

preparing a monocrystalline silicon wafer;

defining a plurality of active areas on the top surface of the wafer;

etching in each active area a pair of vertical trenches spaced apart by a bulk portion of the wafer;

forming a relatively thin dielectric layer over each vertical trench for serving as a capacitor dielectric;

filling each vertical trench with doped polysilicon of a first conductivity type;

forming a first recess in the polysilicon fill of each vertical trench;

forming a relatively thicker dielectric layer on the side walls of said first recesses;

refilling the first recesses with doped polysilicon at the first conductivity type;

forming a second recess in each trench shallower than the first recess;

cleaning the walls of said second recesses for exposing portions of the surrounding monocrystalline bulk;

filling the second recesses of each vertical trench with monocrystalline silicon that is epitaxial with the surrounding monocrystalline bulk and for use as the body of the transistor;

forming trenches in the wafer surrounding each active area to a depth deeper than the second recesses but shallower than the first recesses for exposing portions of the monocrystalline fill of the second recesses;

filling said last recited trenches with silicon oxide;

forming third recesses in said silicon oxide fills to a depth about that of the second recesses for reexposing portions of the monocrystalline fill of the second recesses;

forming a dielectric layer suitable for use as the gate dielectric of the switching transistor over each exposed monocrystalline fill of the second recesses;

filling the recesses in said silicon oxide fills with conductive material for use as the gate conductor of the switching transistor; and providing a region for use as the drain of the switching transistor over the bulk portion of the wafer between the vertical trenches of each pair of vertical trenches within each active area.

3. The process of claim 2 in which the monocrystalline silicon bulk of the wafer and the silicon fill of the second recesses are of the conductivity type opposite said one conductivity type; and the regions provided for use as the sources are also of the conductivity type opposite said one conductivity type.

4. The process of claim 2 in which the source regions of the transistors are formed at the interface between the polysilicon fill of the first recesses and the epitaxial fill of the second recesses.

5. A method for providing in a wafer pairs of memory cells that form a dynamic random access memory in which each cell includes a switch transistor in series with a storage capacitor comprising, the method steps of:

forming in a monocrystalline silicon portion of one conductivity type of the wafer a plurality of vertical trenches spaced apart;

forming over the walls of each of the trenches a first dielectric layer suitable for being the dielectric of the storage capacitor of a cell;

filling each trench with polysilicon doped to be of the conductivity type opposite the one conductivity type;

forming a first recess to a first depth in the polysilicon fill of each trench;

forming a collar dielectric layer thicker than the first dielectric layer over the sidewalls of each first recess;

filling each first recess with doped polysilicon of the opposite conductivity type;

forming in the polysilicon fill of each first recess a second recess of a depth less than the first depth;

removing the collar dielectric layer in each second recess for exposing monocrystalline regions of the wafer;

refilling each second recess by growing silicon epitaxially of the one conductivity type from said exposed regions of the monocrystalline silicon for providing the body of the switch transistor of the cell;

removing portions of the wafer for isolating from one another pairs of epitaxial silicon portions and partially reexposing such epitaxial silicon body portions, the two portions of each pair of isolated epitaxial silicon body portions enclosing therebetween a portion of the monocrystalline silicon portion of the one conductivity type of the wafer;

forming a dielectric layer suitable for use as the gate dielectric of a switch transistor over each exposed epitaxial-silicon body portion;

forming a conductive layer suitable for the gate of a switch transistor over each gate dielectric layer; and forming a conductive layer suitable for use as the common drain of a pair of switch transistors at the top of the monocrystalline silicon portion of the wafer enclosed between the portion of each pair of isolated epitaxial silicon body portions.

6. The method of claim 5 in which a trench shallower than said vertical trenches is formed for isolating each pair of vertical trenches and exposing portions of the epitaxially grown silicon.

7. The process of claim 5 in which there is formed the source region of each transistor at the interface between the polysilicon fill of the first recess and the epitaxial fill of the second recess.

* * * * *